(12) United States Patent
Goto

(10) Patent No.: US 6,209,121 B1
(45) Date of Patent: *Mar. 27, 2001

(54) METHOD AND SYSTEM FOR IMPROVING DELAY ERROR

(75) Inventor: Takashi Goto, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/834,160

(22) Filed: Apr. 14, 1997

(30) Foreign Application Priority Data

Apr. 12, 1996 (JP) .................................... 8-115537

(51) Int. Cl.[7] .................................................. G06F 17/50
(52) U.S. Cl. .................................................. 716/6
(58) Field of Search .................................. 364/488, 489, 364/490, 491; 395/500.11; 716/6

(56) References Cited

U.S. PATENT DOCUMENTS

| | | | |
|---|---|---|---|
| 5,397,749 | * | 3/1995 | Igarashi ........................ 395/500.11 |
| 5,801,958 | * | 9/1998 | Dangolo ........................ 364/489 |
| 5,801,960 | * | 9/1998 | Takano ........................ 364/491 |
| 5,889,677 | * | 3/1999 | Yasuda ........................ 716/6 |

FOREIGN PATENT DOCUMENTS 1-173168  7/1989  (JP) .
7-14927   1/1995  (JP) .

OTHER PUBLICATIONS

Giovanni De Micheli, "Performance–Oriented Synthesis of Large–Scale Domino CMOS Circuits", *IEEE Transactions on Computer–Aided Design*, vol. CAD–6, No. 5, Sep. 1987, pp. 751–765.

* cited by examiner

*Primary Examiner*—Matthew Smith
*Assistant Examiner*—Thuan Do
(74) *Attorney, Agent, or Firm*—Sughrue, Mion, Zinn, Macpeak & Seas, PLLC

(57) ABSTRACT

In a delay error improving process of a logic circuit, delay performance is certainly improved by maintaining layout and wiring path after completion of layout and wiring. A path delay is calculated by a circuit delay period calculating portion using an actual wiring information after wiring process. By the critical path extracting portion, a path not satisfying a delay performance and critical path is extracted. The cell on the critical path is re-arranged with replacing the cell having different delay performance with the same function. The overlap of the replaced cell with the other cell is solved by moving the cell. By the partial re-wiring portion, wiring connected to the replaced cell and the cells moved for overlap solving within the partial wiring region are re-wired and the layout and the wiring path of the cells not influenced by the cell replacement are maintained.

10 Claims, 12 Drawing Sheets

METHOD AND SYSTEM FOR IMPROVING DELAY ERROR

BACKGROUND OF THE INVENTION

1. Field of the Invention

The present invention relates generally to a method and a system for improving a delay error. More specifically, the invention relates to a method and a system for improving a delay error due to circuit layout of a LSI or a printed circuit board, such as a digital logic circuit or the like.

2. Description of the Related Art

Conventionally, a method and a system for improving a delay error of this kind has been used for improving a delay performance of a path which does not satisfy a delay restriction in a layout of an LSI or a printing circuit board.

As prior art, reference is made to Japanese Unexamined Patent Publication (Kokai) Heisei 6-140514; Sho ISHIOKA, Masami MURAKATA, Masako MUROBUSHI, "Experiments and Evaluation of Timing Updating ECO", 6-85, 6-88 (Paper No. 7K–8), Information Processing Society of Japan, No. 45 (latter-half year of 1992), Paper in National Meeting; "Performance-Oriented Synthesis of Large-Scale" (IEEE Transactions on Computer-Aided Design, Vol. CAD-6, No. 5, September, 1987, for example.

In the conventional system, a method for improving delay performance of the critical path is that a delay value is calculated on the basis of a virtual wiring length (length of not fixed wiring but temporarily determined wiring) or an actual wiring length (wiring fixed the path) after wiring process, a critical path (the path which does not satisfy a demanded value or the path close to the demanded value) is extracted, a circuit cell (hereinafter simply referred to as "cell") presenting on the critical path is replaced with a different cell having the same function and a different delay performance, a logical connection information is modified, and subsequently arrangement and wiring process is re-done.

On the other hand, if the delay performance cannot be satisfied merely by replacing with the cell for too large delay, solution has been taken to go back to architecture design for improving delay performance.

In the conventional method as set forth above, even when the delay performance may be improved merely by replacing the cell, it is possible that the delay performance cannot be improved satisfactorily.

This is because that after changing the cell to that having different delay performance, all of the layout and wiring process is re-done from the beginning, and there is no guarantee that the layout position and wiring length are the same as that before changing the cell.

SUMMARY OF THE INVENTION

Therefore, it is an object of the present invention to provide a method and a system for certainly improving delay performance by permitting maintaining of the layout position and wiring path after once layout and wiring are done.

According to one aspect of the present invention, a delay error improving method comprises the steps of:

performing delay analysis using an actual wiring information after wiring process;

extracting an objective cell for replacement on the basis of delay analysis;

replacing the objective cell with a delay improving cell;

resolving overlap of cells caused by cell replacement; and performing re-wiring for the delay improving cell and the cell to be the object of overlap resolving.

Preferably, the step of resolving overlap may comprise the steps of removing the wiring of the objective cell for replacement and the cell to be the object of overlap resolving; and moving the cell to be the object of overlap resolving.

When moving of the cell to be the object of the overlap resolving to adjacent channel is caused, the step of resolving overlap may comprises the steps of:

removing the wiring of the objective cell for replacement and the cell to be the object of overlap resolving;

moving the cell to be the object of overlap resolving to adjacent channel; and adding the virtual terminal on the channel boundary line to which the wiring of the moved cell is connected.

The delay error improving method may further comprise the steps of, after the step of performing rewiring, performing re-calculation of a path delay with respect to the pass on which the replaced cell is present; and performing display of signal path and a delay value when the calculated delay of the path with within a delay restriction value.

A delay error improving method may further comprise the steps of, after the step of re-wiring, performing a path delay with respect to the path on which the replaced cell is present, and further performing replacement of other cell in the same path when the path delay still exceeds a delay restriction value.

When the path delay still exceeds a delay restriction value and other cell is not present in the same path, a display of improvement incompleteness may be performed.

According another aspect of the invention, a delay error improving system comprises:

a delay analyzing portion performing delay analysis using an actual wiring information after wiring process;

a cell extracting portion extracting an objective cell for replacement on the basis of delay analysis;

a cell replacing portion replacing the objective cell with a delay improving cell;

an overlap resolving portion resolving overlap of cells caused by cell replacement; and a re-wiring portion performing re-wiring for the delay improving cell and the cell to be the object of overlap resolving.

The resolving overlap may comprises:

a wiring removing portion removing the wiring of the objective cell for replacement and the cell to be the object of overlap resolving; and a cell moving portion moving the cell to be the object of overlap resolving.

The resolving overlap portion may comprise:

a wiring removing portion removing the wiring of the objective cell for replacement and the cell to be the object of overlap resolving when moving of the cell to be the object of the overlap resolving to adjacent channel is caused,;

a cell moving portion moving the cell to be the object of overlap resolving to adjacent channel; and a virtual terminal adding portion adding the virtual terminal on the channel boundary line to which the wiring of the moved cell is connected.

The delay error improving system may further comprises,
a path delay re-calculating portion performing re-calculation of a path delay with respect to the pass on which the replaced cell is present after completion of process in the re-wiring portion after completion of process of the re-wiring portion; and an improved path displaying portion performing display of signal path and a delay value when the calculated delay of the path with within a delay restriction value.

The delay error improving system may further comprise a cell re-replacement portion further performing replacement of other cell in the same path when the path delay still exceeds a delay restriction value, when the path delay exceeds a delay restricting value. The delay error improving system may further comprise an improvement incompleteness displaying portion displaying of improvement incompleteness when the path delay still exceeds a delay restriction value and other cell is not present in the same path.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

Figure 1:
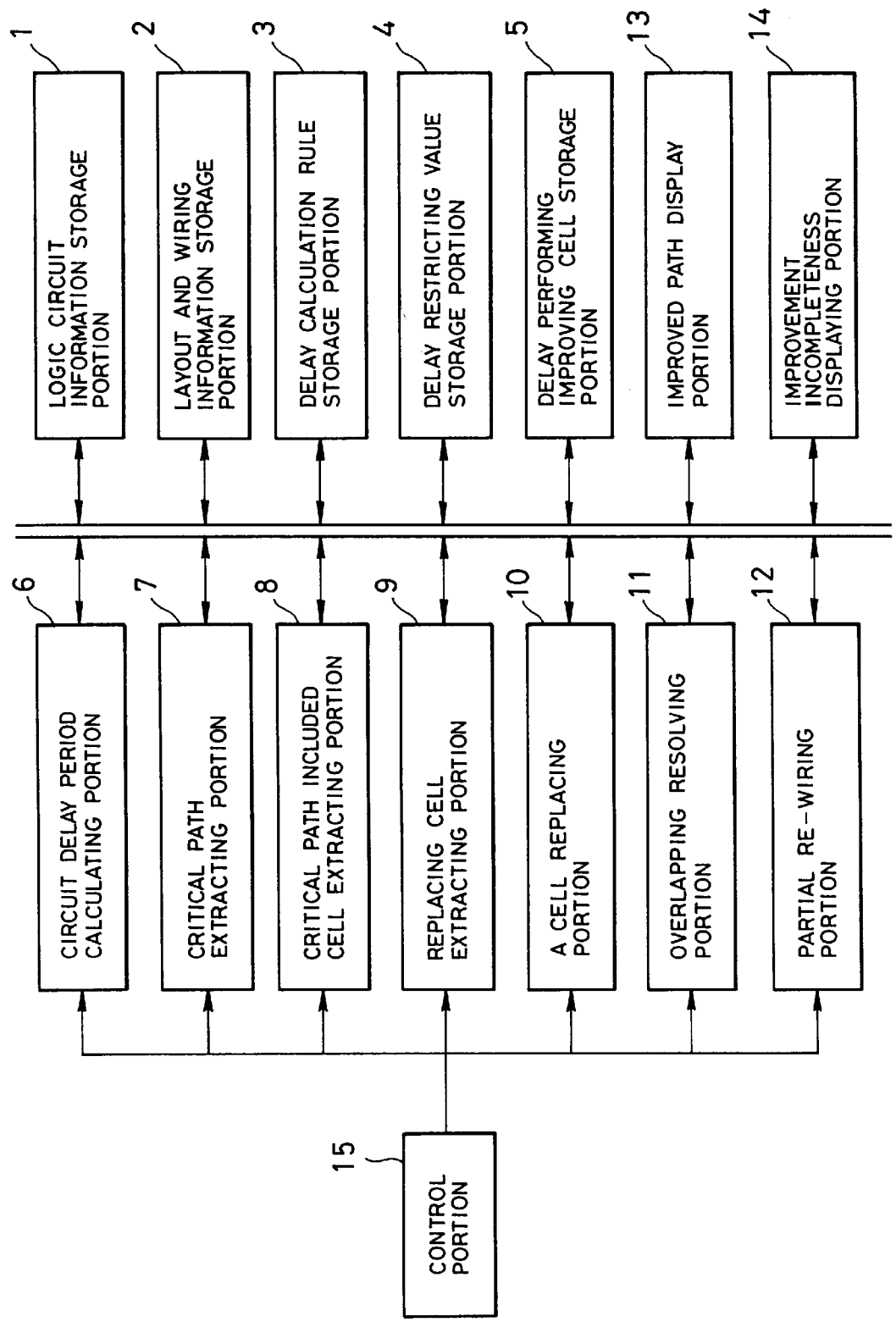
FIG. 1 is a schematic block diagram showing a construction of one embodiment of a delay error improving system according to the present invention.

FIG. 1 is a schematic block diagram showing one embodiment of a delay error improving system according to the present invention. Referring to FIG. 1, the shown embodiment of the delay error improving system according to the present invention includes a circuit delay period calculating portion 6 for performing analysis of delay utilizing an actual wiring information after wiring process, a critical path for extracting a portion 7 extracting critical path with respect to all paths derived by the circuit delay period calculating portion 6, a critical path included cell for extracting portion 8 extracting cells within the critical path , a replacing cell extracting portion 9 for retrieving a cell which can a delay performance of the path and extracting such cell as an objective cell for replacement, a cell for replacing portion 10 replacing the cell on the critical path with the cell on other circuit and having different delay performance to modify layout, an overlapping resolving portion 11 for modifying layout of the cell overlapping with the replaced cell, and a partial for re-wiring portion 12 re-wiring the wiring connected to the terminals of those cells by removing wiring and effecting wiring again within a partial re-wiring region.

In the shown embodiment, upon performing delay improving process, instead of re-doing all of layout upon cell replacement, modification of the layout is done only for the replaced cell and the cell overlapping with the replaced cell. Thus, movement of the other cells are prevented. Furthermore, by performing re-wiring of the wiring connected to the cells, for which the layout is modified, per partial re-wiring region so that wiring for those out of the partial re-wiring region can be maintained. Thus, variation of the actual wiring length can restricted during improvement of delay of the critical path.

The preferred embodiment of a delay error improving method according to the present invention will be discussed hereinafter in detail so as to describe the shown embodiment of the delay error improving system according to the invention in greater detail.

Referring to FIG. 1, a logic circuit information storage portion 1 stores a connection information of a logic circuit, a layout and wiring information storage portion 2 stores a layout after performing layout of the circuit. A delay calculation rule storage portion 3 stores parameters necessary for calculating the circuit delay period, and a delay restricting value storage portion 4 for storing a delay restricting value of the circuits.

A delay performing improving cell storage portion 5 stores a cell having a difference delay performance than a certain cell having the same function.

The circuit delay calculating period portion 6 performs calculation of the delay period of the circuit employing an actual wiring length on the basis of the logic connection information, the layout and wiring information and delay calculation rule. On the other hand, the circuit delay period calculating portion 6 performs calculation of the delay period with respect to all paths or some specific path.

The critical path extracting portion 7 extracts a signal path which does not satisfy the delay restriction value on the basis of the circuit delay period, the logic connection information and the delay restriction value, as the critical path, with respect to all paths.

The critical path included cell extracting portion 8 extracts cells on the path of each critical path extracted by the critical extracting portion 7.

The replacing cell extracting portion 9 retrieves whether the cell extracted by the critical path included cell extracting portion 8 is included in the delay improving cells. If the cell is included in the delay improving cells and if the cell which can improve delay performance of the cell among the delay improving cells, such cell is set as the objective cell for replacement.

The cell replacing portion 10 replaces the objective cell extracted by the replacing cell extracting portion 9 with the delay improving cell and updates the logic connection information. Also, the cell replacing portion 10 placing the delay improving cell at the position where the objective cell was placed to update layout and wiring information.

The overlapping eliminating portion 11 is active when the overlapping of the replaced cell with other cell as a result of replacement of the objective cell with the delay improving cell in modification of the layout and wiring information in the cell replacing portion 10, to modify the layout position of other cell to the position not overlapping with the replaced cell and update the layout and wiring information.

The partial re-wiring portion 12 performs removal of the wiring and re-wiring per partial wiring region with respect to the wiring connected to the replaced cell and the cells which are modified the layout and updates the layout and wiring information.

Figure 2:
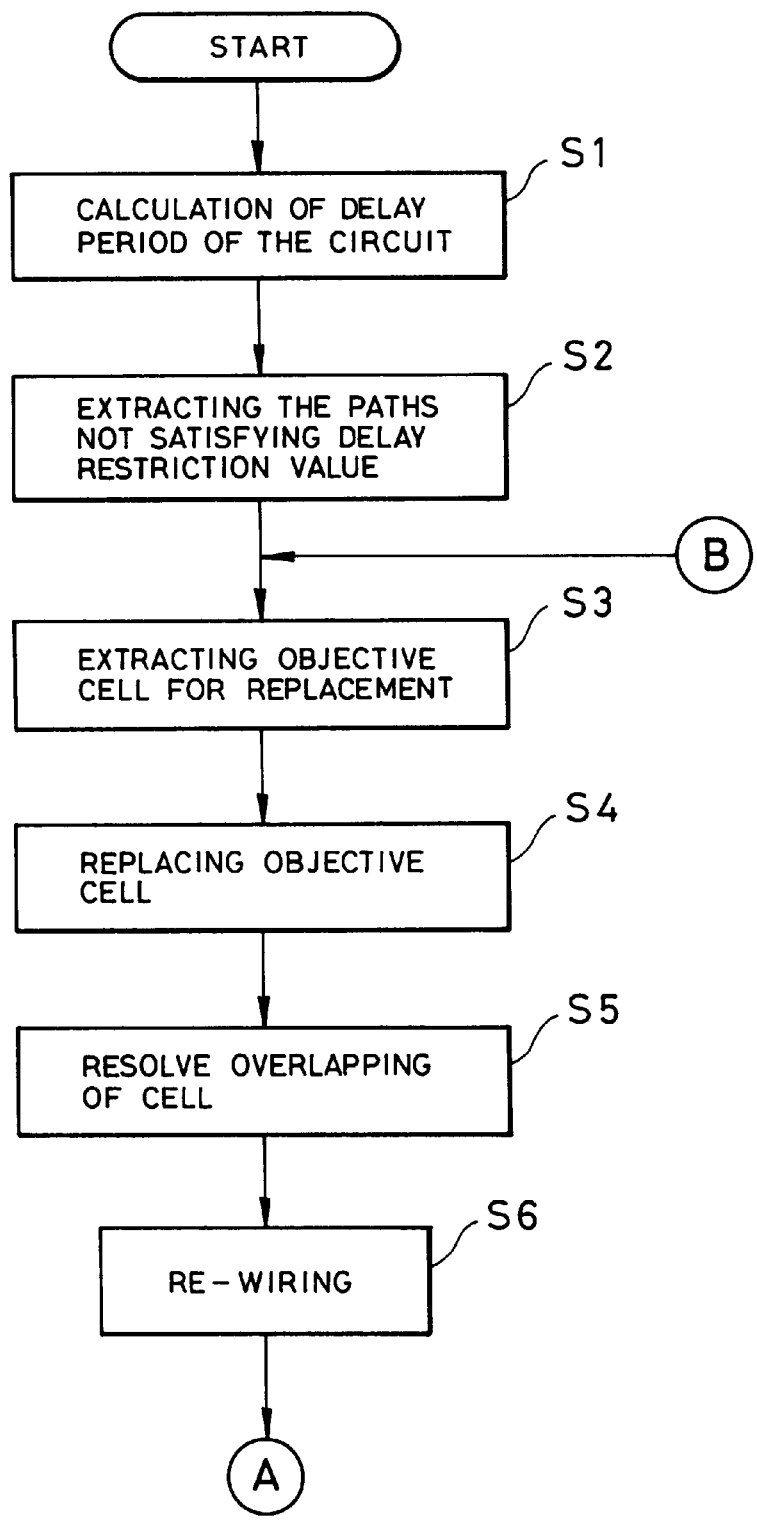
FIG. 2 is a flowchart showing operation from calculation of a circuit delay period to partial re-wiring.

FIG. 2 is a flowchart showing a process of operations from the circuit delay period calculating portion 6 to the partial re-wiring portion 12.

Namely, at first, calculation of delay period of the circuit is performed (S1). Then, on the basis of the circuit delay period or so forth, the paths not satisfying the delay restriction value are extracted as the critical paths (S2). Next, the objective cell for replacement is extracted (S3).

Next, the objective cell is replaced with the delay improving cell (S4). When overlap is caused between the delay improving cell and other cell, the overlap is eliminated by re-arranging the cells (S5). Then, re-wiring is performed for the replaced cell and the cells which are changed the layout for overlapping elimination (S6).

Upon replacement of the cells at step S4, the logic connection information stored in the logic circuit information storage portion 1 and the layout and wiring information stored on the layout and wiring information storage portion 2 are updated.

Further description will be given for the overlapping resolving portion 11 and the partial re-wiring portion 12 with reference to FIGS. 3 to 10.

In determination of wiring path of LSI, vertical and horizontal boundary lines are set on a wiring region to define a partial wiring region (hereinafter referred to as "channel") separated by the boundary lines.

When wiring is performed between the cells, it has been widely taken a method, in which, instead of determining the wiring path between the terminals of cells, at first, with respect to all of the wiring, channels to pass respective wiring is determined (rough wiring process) is performed, and subsequently, detailed wiring path is determined per each individual channel (detailed wiring process). Concerning the rough wiring process and detailed wiring process, reference will be made to Kozo KINOSHITA, "CAD for Logic Circuit", Information Processing Society of Japan, Mar. 20, 1981, page 49, or so forth.

Figure 3:
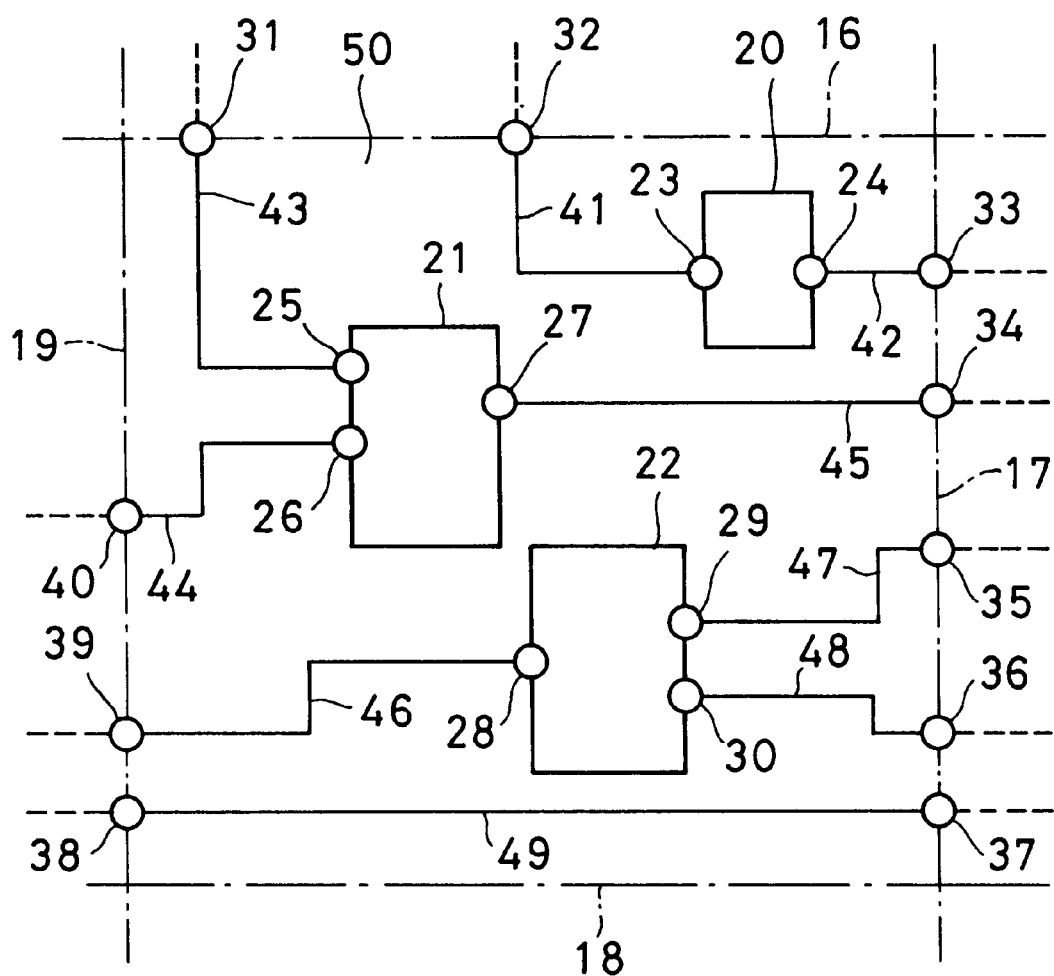
FIG. 3 is a circuit diagram exemplifying a designed circuit, in which is illustrated a layout and wiring condition after detailed wiring of a circuit in a single layer LSI.

FIG. 3 shows a portion of a circuit diagram showing layout and wiring after detailed wiring in a single layer LSI. The layout and wiring information shown in FIG. 3 is stored in the layout and wiring information storage portion 2.

As shown in FIG. 3, with a channel 50 defined by channel boundary lines 16, 17, 18 and 19, cells 20, 21 and 22 are arranged. Virtual terminals 31, 32, 33, 34, 35, 36, 37, 38, 39 and 40 are set on the channel boundary lines when the rough wiring of net passes through channel boundary lines in the rough wiring process.

The rough wiring passing between the channels are divided as wiring of respective channels by virtual terminals. With respect to the rough wiring divided per channel unit, detailed wiring process is performed.

Wiring 41, 42, 43, 44, 45, 46, 47, 48 and 49 are actual wiring (wiring for which shape thereof is determined) from the virtual terminals to the actual terminal and other virtual terminals, which are determined after detailed wiring process.

Here, the cell 21 selected by the replacing cell extracting portion 9 is replaced with the delay improving cell 51.

Figure 4:
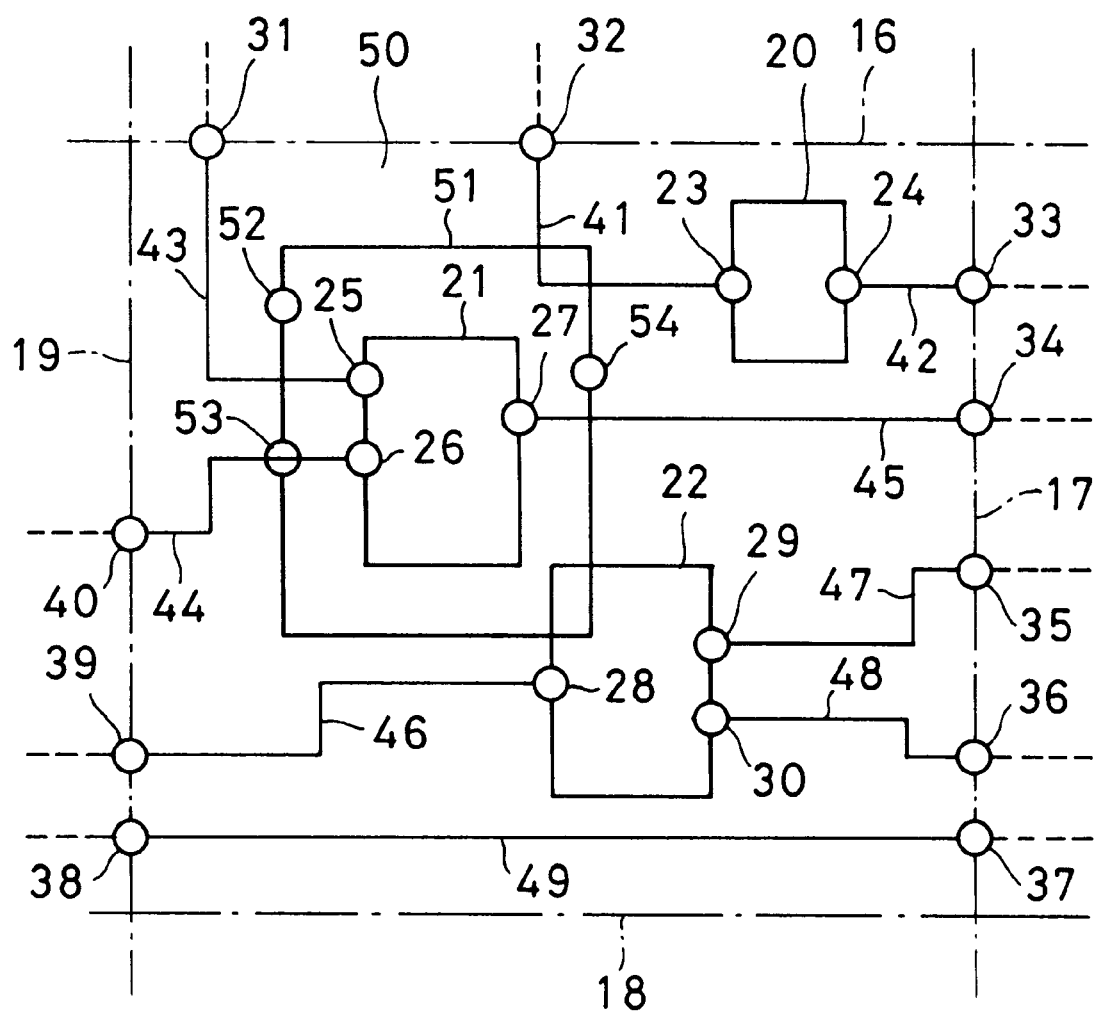
FIG. 4 is a circuit diagram similar to FIG. 3 but showing a condition where cell replacement is effected.

As shown in FIG. 4, delay improving cell 51 is attempted to arrange to the position where the objective cell 21 is arranged. Then, between the delay improving cell 51 and cell 22 and between the delay improving cell 51 and the wiring 41, overlap is caused.

Figure 5:
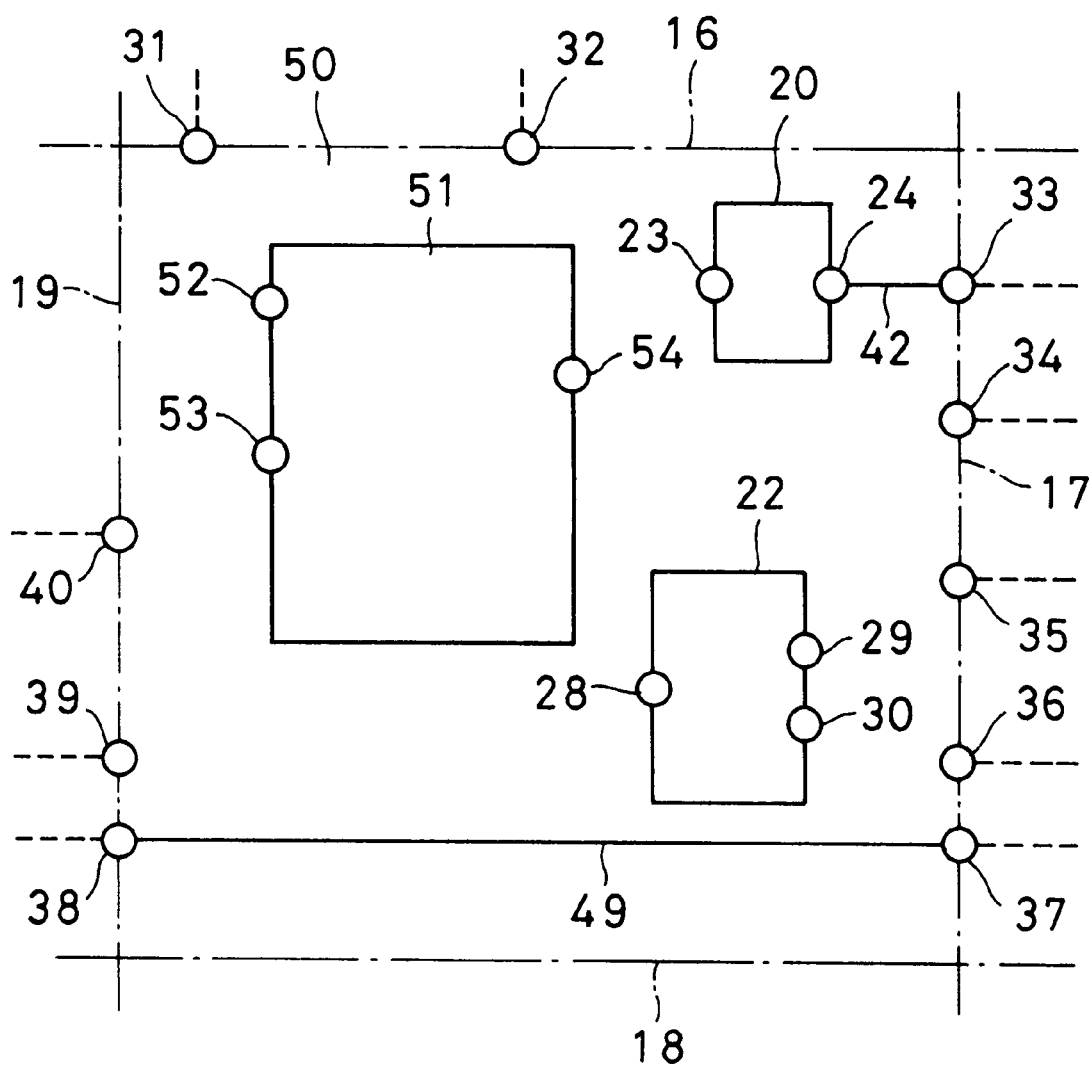
FIG. 5 is a circuit diagram similar to FIGS. 3 and 4 but showing a condition where an overlap elimination is performed.

In such case, the overlapping resolving portion 11 moves the cell 22 to the position not overlapping with the cell 51, as shown in FIG. 5.

At this time, if the cell thus moved again overlaps with other cell, such other cell is moved.

Re-arrangement is performed so that the arranged delay improving cell is performed so as not to cause overlap of the cell which has already been the object for rearrangement. The wiring 41, 43, 44, 45, 46, 47 and 48 connected to the cell and the moved cell 22 are removed as shown in FIG. 5.

Figure 6:
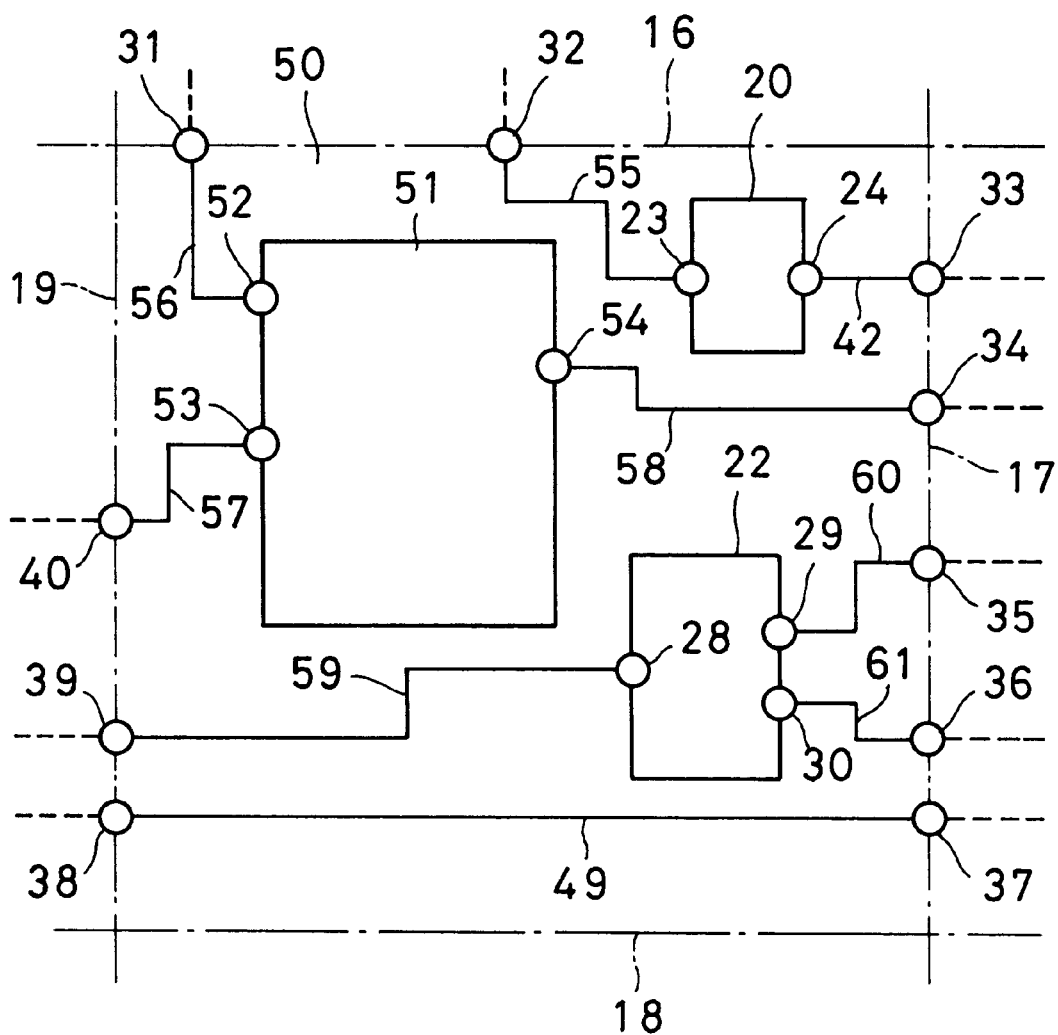
FIG. 6 is a circuit diagram similar to FIGS. 3 to 5, but showing a condition where a partial re-wiring is performed.

The partial re-wiring portion 12 re-wire the wiring 41, 43, 44, 45, 46, 47 and 48 removed by the overlapping resolving portion 11 as wiring 55, 56, 57, 58, 59, 60 and 61 as shown in FIG. 6.

The wiring out of the channel and the wiring connected to not moved other cells by cell replacement can be maintained.

Figure 11:
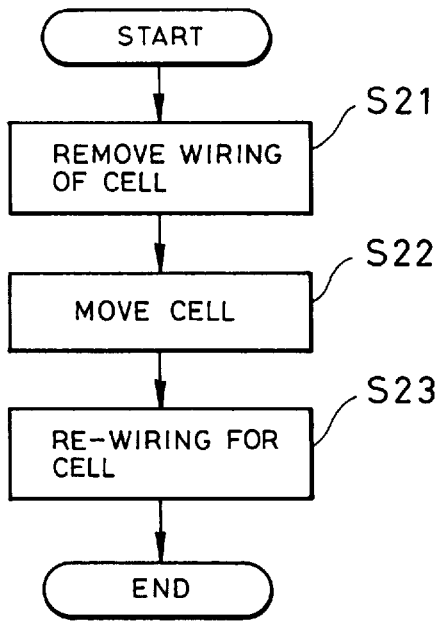
FIG. 11 is flowchart showing overlap elimination process.

Operation subsequent to the overlapping resolving portion 11 is illustrated in FIG. 11.

Namely, the wiring connected to the cells causing overlapping are removed (S21). Next, the cell is moved (S22). Next, re-wiring is performed for the moved cell (S23). Then, operation is completed.

Thus, when the actual terminal of the objective cell or the actual terminal of the moved cell moved by cell replacement and overlapping elimination beyond the channel region, as the process to be added for the process, addition and deletion of the virtual terminal presenting on the channel boundary line, removal and re-wiring is performed with respect to the channel, to which the cell and the moved cell extend.

Figure 7:
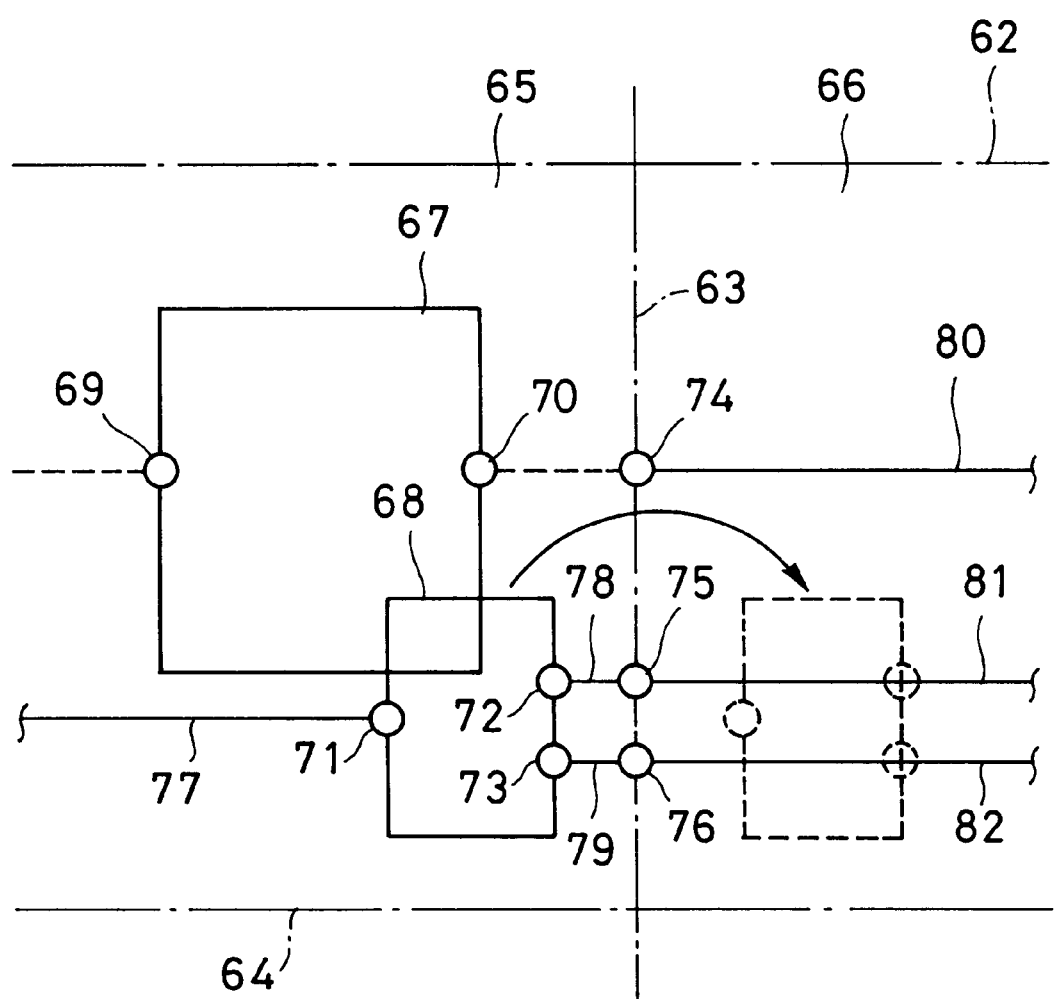
FIG. 7 is a circuit diagram similar to FIG. 4, but showing another example of cell replacement.

Next, as shown in FIG. 7, discussion will be given for the case where overlap is caused with a cell 68 by arranging a delay improving cell 67, and the cell 68 is moved from channel 65 to channel 66.

Figure 8:
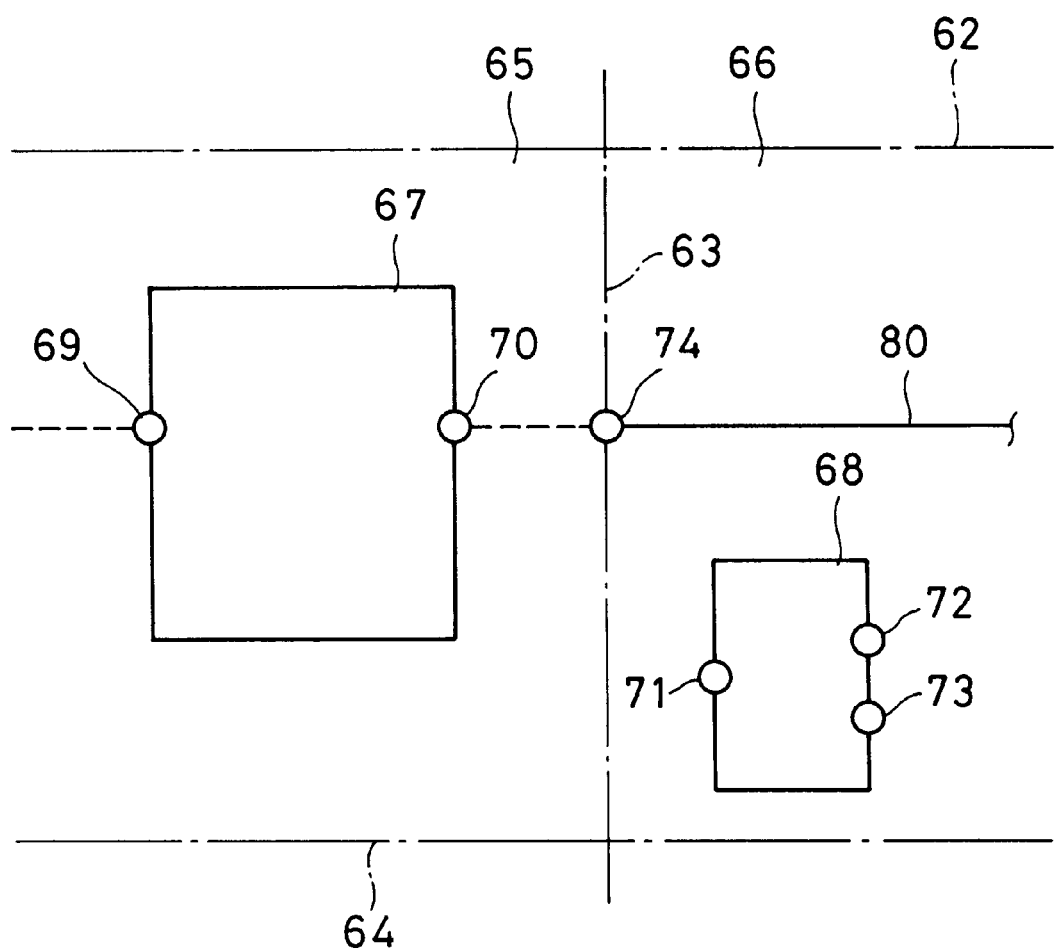
FIG. 8 is a circuit diagram similar to FIG. 7, but showing a condition where an overlap elimination is performed.

When movement is caused by occurrence of overlapping as shown in FIG. 7, the wiring 77, 78 and 79 connected to the actual terminals 71, 72 and 73 of the cell 68 are removed as shown in FIG. 8. Also, the virtual terminals 75 and 76 connected the wiring 78 and 79 present on the channel boundary line 63 as the boundary of the channels 65 and 66 are removed. Furthermore, the wiring 81 and 82 in the channel 66 connected to the virtual terminals 75 and 76 are removed.

Figure 9:
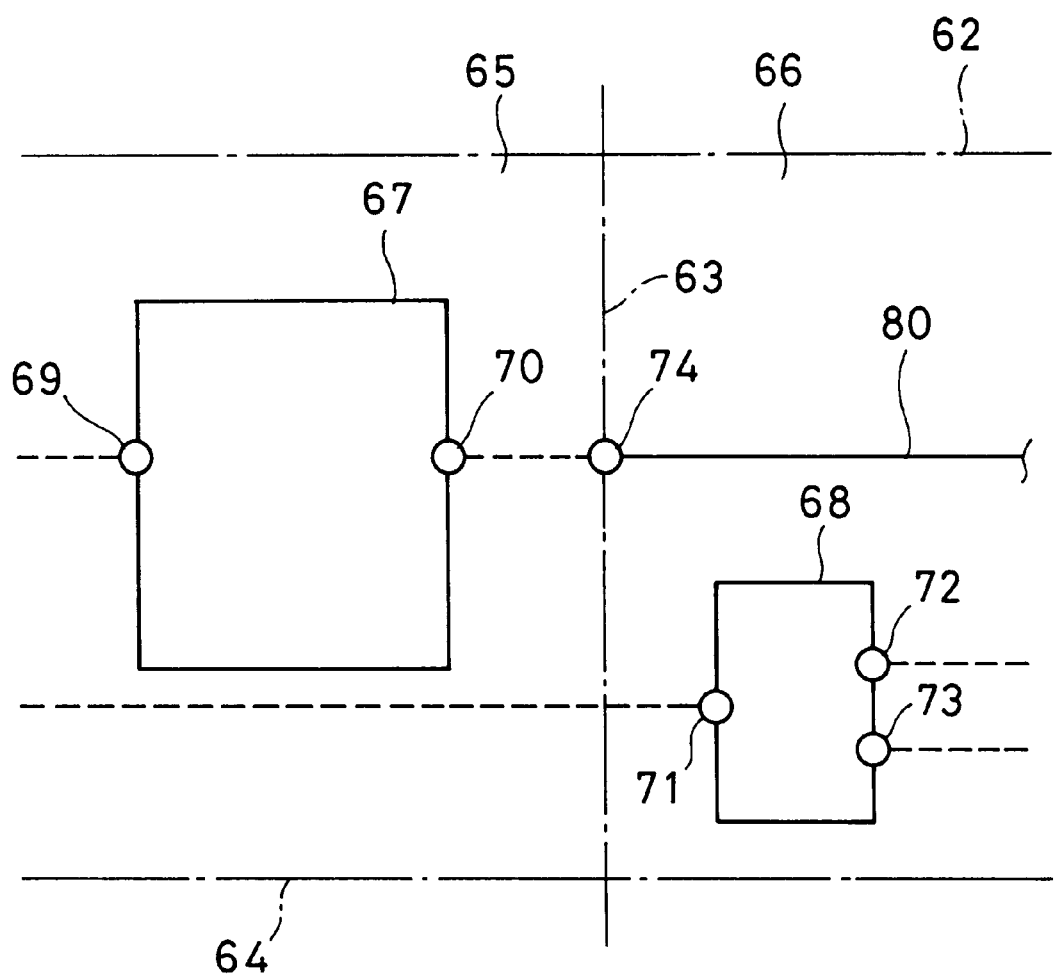
FIG. 9 is a circuit diagram similar to FIGS. 7 and 8 but showing a condition where a partial re-wiring is performed with respect to a circuit shown in FIG. 10.
Figure 10:
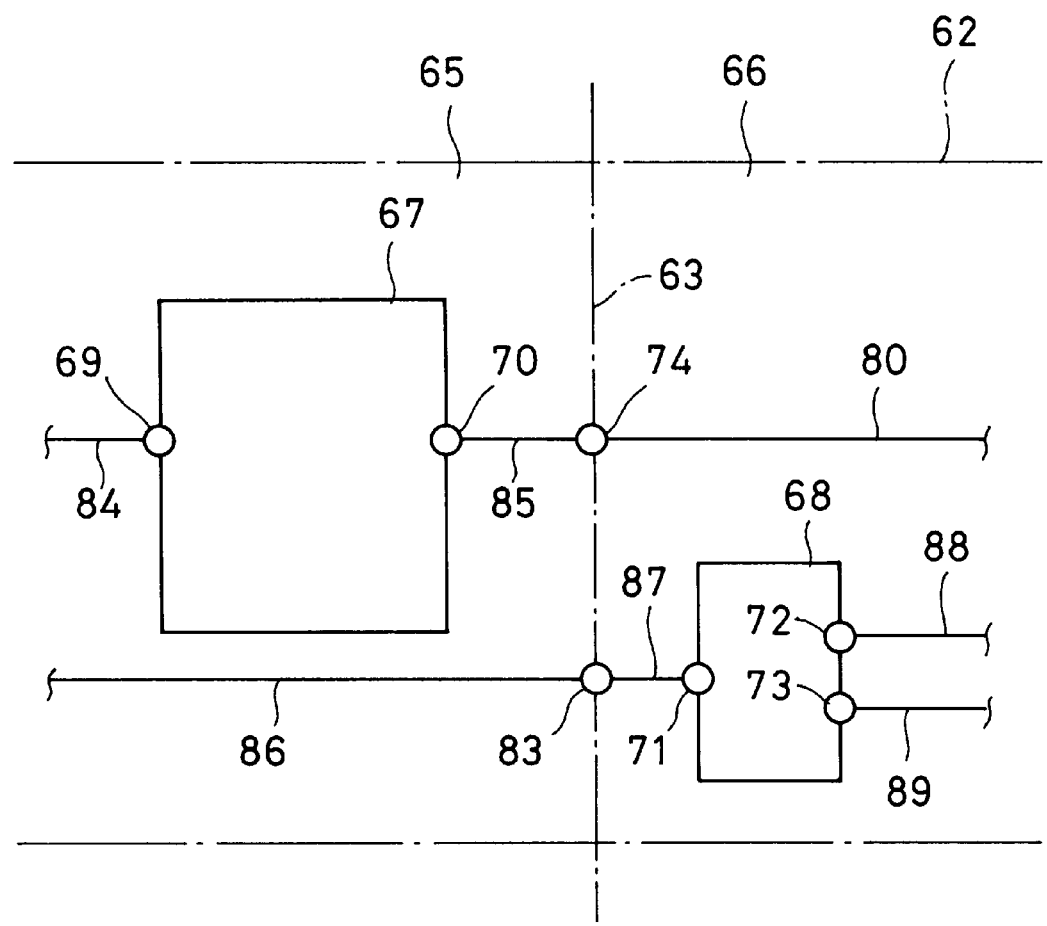
FIG. 10 is a circuit diagram similar to FIG. 7, but showing a condition where an overlap elimination is performed.

As shown in FIG. 9, if re-wiring is to be performed for actual terminals 71, 72 and 73 of the cell 68, the wiring connected to the actual terminal 71 passes through the channel boundary line 63. In this case, as shown in FIG. 10, a new virtual terminal 83 is added to the position where the wiring on the channel boundary line passes so that the wiring passing across the channel boundary line 63 is divided per each channel.

Next, re-wiring is performed with respect to the wiring divided per channels, wiring 86 in the channel 65 is extended to the virtual terminal 83. Re-wiring is performed for establish wiring 87 from the virtual terminal 83 in the channel 66 to the actual terminal 71. The wiring 88 and 89 is re-wired by connecting actual terminals 72 and 73.

Figure 12:
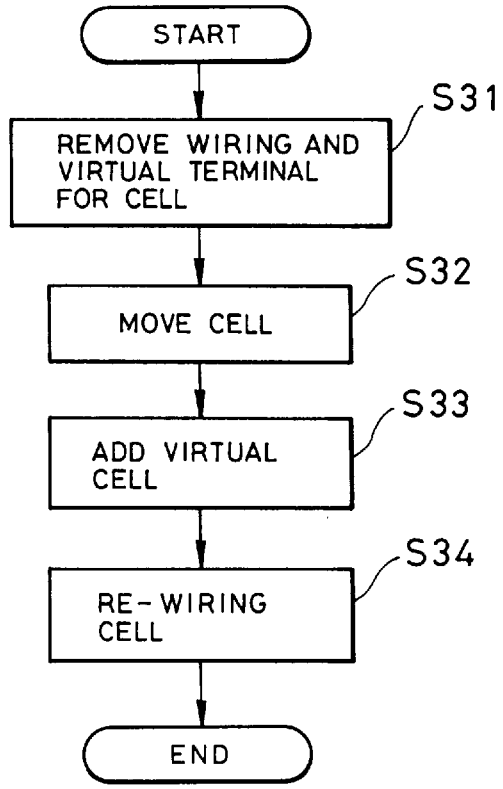
FIG. 12 is a flowchart showing operation in the case where a channel is shifted.

FIG. 12 is a flowchart showing operation in the case where the cell is moved across the channels.

Namely, the wiring and virtual terminal connected to the cell causing overlap are removed (S31). Then, the cell is moved to the adjacent channel (S32). Then, the virtual terminal is added on the channel boundary line (S33). Thereafter, re-wiring is performed for the cell (S34). Then, operation ends.

Next, again with reference to FIG. 1, by circuit delay period calculating portion 6, re-calculation of pass delay is performed with respect to the path on the replaced cell. As a result of re-calculation, when the path satisfies the delay restriction value, display of the signal path and the delay value is performed by the improved path display portion 13. When the delay restriction value is not satisfied, within the cell extracted by the critical path included cell extracting portion 8, with respect to the cell in the critical path which has not been the object for replacement, the process in respective portions 9 to 12 is repeated.

If the path delay value does not satisfy the delay restriction value, by an improvement incomplete path display portion 14, the path name and the delay value are displayed. With respect to all critical paths of the portion of 6, 8 to 14, the control portion 15 controls all portions 1 to 14 as set forth above.

Figure 13:
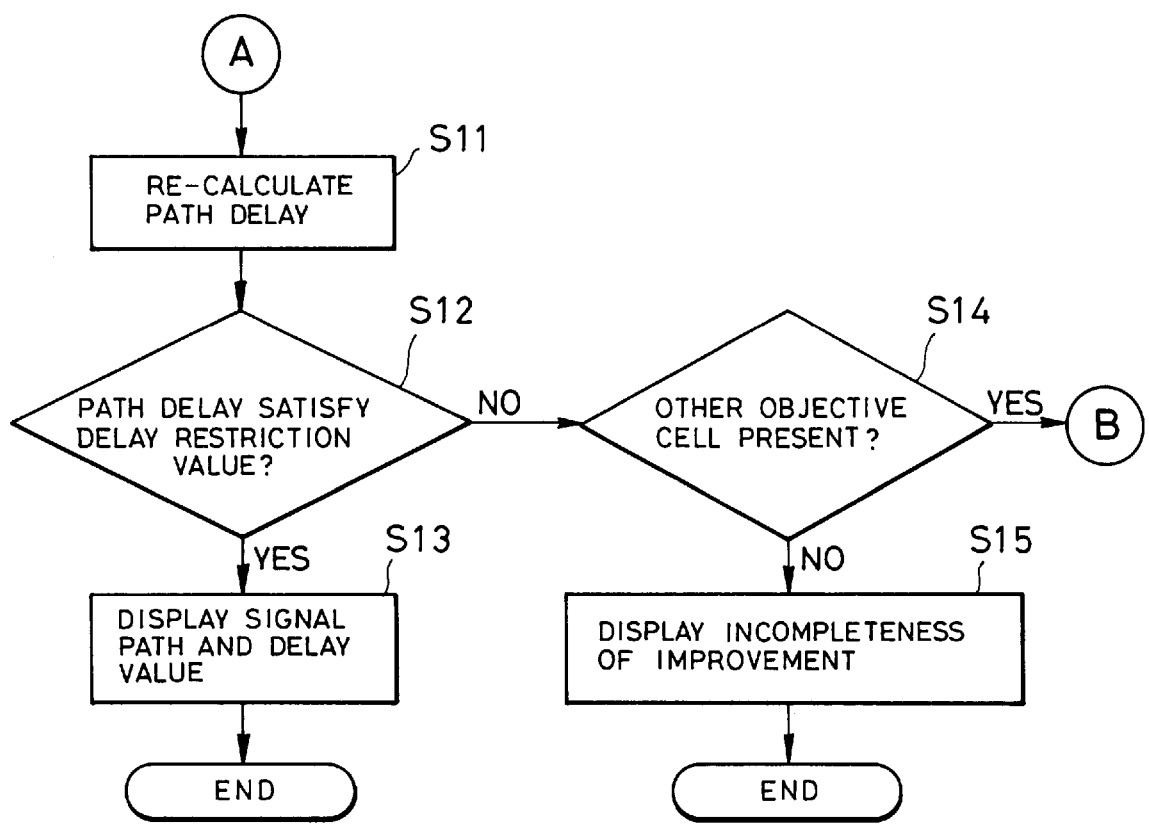
FIG. 13 is a flowchart showing operation of re-calculation of a path delay.

FIG. 13 is a flowchart showing operation of re-calculation of path delay following the circuit delay calculating portion 6.

Namely, re-calculation of the path delay is performed for the path where the cell is replaced (S11). Then, check is performed whether the result of re-calculation of the path satisfies the delay restriction value (S12). When the delay restriction value is satisfied, display of the signal path and the delay value is performed (S13). Thereafter, process goes end.

On the other hand, when the delay restriction value is not satisfied as checked at step 12, check is performed whether the objective cell for replacement is present or not (S14). If cell is present, the process returns to step S3 of FIG. 2 to perform process of steps S3 to S6 and steps S11 and S12 of FIG. 13 are repeated.

Then, when the objective cell for replacement is not present as checked at step S14, improvement non-completion display is performed (S15). Then, process goes end.

As set forth above, according to the present invention, guarantee is given for improving delay performance by the cell replacement, delay of critical path is certainly improved. This is because modification of layout associated with cell replacement in the delay improvement process is not performed from the beginning but only for the replaced cell and the cells influenced by the replacement, and movement of other cells is prevented. Furthermore, in the present invention, re-wiring of the wiring connected to the terminal of the moved cell to perform per partial wiring region. Wiring of the not moved cell and corrected partial wiring region are stored.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A method for reducing delay error in a circuit comprising the steps of:

performing delay analysis on a wired circuit using an actual wiring information;

determining an object cell for replacement based on the delay analysis;

replacing the object cell with a delay improving cell having an improved delay characteristic;

eliminating an overlap of cells caused by replacing the object cell with the delay improving cell;

re-wiring said delay improving cell and cells which overlapped the delay improving cells;

performing delay analysis with respect to a signal path on which the delay improving cell is present; and displaying a message indicating non-completion of delay improvement when a calculated path delay exceeds path delay restriction value and no other cell is present in the signal path.

2. A method for reducing delay error as set forth in claim 1, wherein said step of eliminating overlap comprises:

removing wiring of a cell which overlaps with said delay improving cell; and moving said cell which overlaps with said delay improving cell.

3. A method for reducing delay error as set forth in claim 1, wherein said step of eliminating overlap comprises the steps of:

removing wiring of a cell which overlaps with said delay improving cell;

moving said cell which overlaps with said delay improving cell to an adjacent channel; and adding a new virtual terminal on a channel boundary line of said adjacent channel.

4. A method for reducing delay error as set forth in claim 1 which, after the step of performing delay analysis, further comprises the step of:

displaying said signal path and a calculated delay value of the signal path when the calculated delay value satisfies a delay restriction value.

5. A method for reducing delay error as set forth in claim 1, which, after the step of performing delay analysis, further comprises the of:

replacing another cell in the signal path when a calculated path delay exceeds a delay restriction value.

6. A system for reducing delay error in a circuit comprising:
- a delay analyzing portion for performing delay analysis on a wired circuit using an actual wiring information;
- a cell extracting portion for determining an object cell for replacement based on the delay analysis;
- a cell replacing portion for replacing the object cell with a delay improving cell having an improved delay characteristic;
- an overlap eliminating portion for eliminating an overlap of calls caused by replacing the object cell with the delay improving cell;
- a re-wiring portion for re-wiring for said delay improving cell and cells which overlapped the delay improving cell;
- a path delay re-calculating portion for re-calculating a path delay of a signal path on which the replaced cell is present after said re-wiring portion re-wires said delay improving cell and said cells which overlapped the delay improving cell; and
- a displaying portion for displaying of a message indicating non-completion of delay improvement when a calculated path delay exceeds a delay restriction value after replacing said object cell and no other cell is present in the same path.

7. A system for reducing delay error as set forth in claim 6, wherein said overlap eliminating portion comprises:
- a wiring removing portion for removing wiring of said object cell and a cell which overlaps with said delay improving cell; and
- a cell moving portion for moving said cell which overlaps with said delay improving cell.

8. A system for reducing delay error as set forth in claim 7, wherein said overlap eliminating portion further comprises:
- a virtual terminal adding portion for adding a new virtual terminal on a channel boundary line of an adjacent channel if said cell which overlaps with said delay improving cell is moved to said adjacent cell by said cell moving portion.

9. A system for reducing delay error as set forth in claim 6, further comprising
- an improved path displaying portion for displaying said signal path and a calculated delay of the signal path when the calculated delay satisfies a delay restriction value.

10. A system for reducing delay error as set forth in claim 6, wherein said cell replacing portion replaces another cell in the signal path when a calculated path delay exceeds a delay restriction value after replacing said object cell.

* * * * *